US006628696B2

(12) United States Patent
Thornton (10) Patent No.: US 6,628,696 B2
(45) Date of Patent: Sep. 30, 2003

(54) MULTI-CHANNEL DWDM TRANSMITTER BASED ON A VERTICAL CAVITY SURFACE EMITTING LASER

(75) Inventor: Robert L. Thornton, Los Altos, CA (US)

(73) Assignee: Siros Technologies, Inc., Davis, CA (US)

( * ) Notice: Subject to any disclaimer, the term of this patent is extended or adjusted under 35 U.S.C. 154(b) by 46 days.

(21) Appl. No.: 09/817,362

(22) Filed: Mar. 20, 2001

(65) Prior Publication Data

US 2002/0097768 A1 Jul. 25, 2002

Related U.S. Application Data

(60) Provisional application No. 60/263,060, filed on Jan. 19, 2001.

(51) Int. Cl.[7] ................................................ H01S 3/08
(52) U.S. Cl. .......................... 372/98; 372/22; 372/46; 372/70; 372/92; 372/99
(58) Field of Search ........................ 372/70, 99, 46, 372/22, 98, 50, 92

(56) References Cited

U.S. PATENT DOCUMENTS

| | | | |
|---|---|---|---|
| 4,914,658 A | 4/1990 | Stankov et al. ............... 372/18 |
| 4,982,406 A | 1/1991 | Facklam ...................... 372/18 |
| 5,130,997 A | 7/1992 | Ortiz et al. ................... 372/21 |
| 5,140,599 A | 8/1992 | Trutna, Jr. et al. ............ 372/20 |
| 5,214,524 A | 5/1993 | Shigematsu et al. ......... 359/124 |
| 5,218,610 A | 6/1993 | Dixon ......................... 372/20 |
| 5,301,201 A | 4/1994 | Dutta et al. ................... 372/43 |
| 5,347,525 A | 9/1994 | Faris .......................... 372/19 |
| 5,526,155 A | 6/1996 | Knox et al. ................... 359/130 |
| 5,600,466 A | 2/1997 | Tsushima et al. ............. 359/124 |
| 5,631,758 A | 5/1997 | Knox et al. ................... 359/127 |
| 5,850,292 A | 12/1998 | Braun ......................... 356/419 |
| 5,903,590 A * | 5/1999 | Hadley et al. ................ 372/46 |
| 6,141,127 A | 10/2000 | Boivin et al. ................ 359/124 |
| 6,167,068 A * | 12/2000 | Caprara et al. ............... 372/22 |
| 6,327,293 B1 * | 12/2001 | Salokatve et al. ............ 372/99 |
| 6,370,168 B1 * | 4/2002 | Spinelli ....................... 372/98 |
| 6,404,522 B1 | 6/2002 | Handelman .................. 359/124 |

OTHER PUBLICATIONS

J. R. Andrews, "Electronically tunable single–mode external–cavity diode laser", *Optics Letters*, vol. 16, No. 10, pp. 732–734, May 1991.

U. Fiedleer et al., "Design of VCSELs for Feedback Insensitive Data Transmission and External Cavity Active Mode–Locking", *IEEE JSTQE*, vol. 1, No. 2, pp. 442–450, Jun. 1995.

J. Boucart et al., "I mW CW–RT Monolithic VCSEL at 1.55 mm", *IEEE Photonics Technology Letters*, vol. 11, No. 6, pp. xxx, Jun. 1999.

Wilmsen et al., *Vertical Cell Surface Emitting Lasers*, Cambridge University Press, 1999, Paperbace Ed. 2001.

* cited by examiner

Primary Examiner—Albert W. Paladini
(74) Attorney, Agent, or Firm—Sierra Patent Group, Ltd.

(57) ABSTRACT

A multi-channel light source for use with a wavelength division multiplexed optical communication system includes a modified vertical cavity surface emitting laser (VCSEL) including a gain region and a resonator reflector layer at a first end for coupling with an optical fiber. An optical or electrical pumping source excites a gain region of the laser. An external cavity couples at a second end of the modified VCSEL and has a mirrored end for forming a resonant cavity with the resonator reflector layer permitting the light source to produce a multi-channel optical signal. The modified VCSEL has a cavity length that is substantially extended compared with a conventional VCSEL.

82 Claims, 4 Drawing Sheets

Air Cavity for minimum dispersion

FIG. 5A

Multi-element Glass system
for dispersion compensation

FIG. 5B

MULTI-CHANNEL DWDM TRANSMITTER BASED ON A VERTICAL CAVITY SURFACE EMITTING LASER

PRIORITY

This application claims the benefit of priority to U.S. provisional application No. 60/263,060, filed Jan. 19, 2001.

BACKGROUND OF THE INVENTION

Wavelength division multiplexed optical communication systems are characterized by multiple channel output over single optical fibers. Conventional systems use a single light source for each channel, wherein each light source is configured to emit at the particular frequency that has been uniquely assigned to it among the multiple frequencies emitted by the system. The emission frequency of each light source is precisely controlled. A typical system will employ several (e.g., 5–100) of these light sources emitting at precisely controlled frequencies. Standards exist which govern the desired spacing between frequencies in such systems, and spacing values of 25, 50, or 100 GHz are typical values being discussed for current and emerging systems.

Currently, these conventional sources are DFB lasers emitting at fixed and precisely controlled wavelengths. In this scenario, a discrete laser is required for each transmission channel. Due to the large number of channels desired, a large number of discrete lasers is required, and the system becomes large and complex, and has a large number of components subject to failure at any one time. Because of the possibility of failure, a system with a large number of lasers will also require a large number of spare lasers for replacement.

There is at present a desire to partially solve this problem by using sources that are tunable, such that a single laser source may be used to emit at multiple frequencies, allowing some reduced number of spare lasers to be used to cover the frequency span of interest. A large, albeit reduced, number of laser sources are still used in this technique, although the number may be made to be more manageable with this approach. In addition, this approach does not solve the problem of increased laser count as channel count increases.

U.S. Pat. No. 5,347,525 describes an arrangement wherein a master oscillator emits at multiple frequencies as a multimode laser. A modulation/amplification section then amplifies and individually modulates the cavity modes before multiplexing the modes and coupling them to a communication system. The master oscillator is selected as a diode pumped solid state laser (DPSSL) in the '525 patent due partly because the linewidths and number of modes available with conventional diode lasers doesn't allow for multimode optical communication over a sufficiently high number of resolved frequencies. In addition, the master oscillator/modulator-amplifier design of the '525 patent entails an extra component adding to the complexity of the arrangement.

Fiedler and Ebeling disclose a vertical cavity surface emitting laser (VCSEL) and fiber resonator with a dielectric mirror at IEEE Journal of Selected Topics in Quantum Electronics, Vol. 1, no. 2, pp. 442–450 (June 1995). Multiple closely-spaced (<1 GHz) optical communication modes are described as being achieved with this system. The cavity length is around 18.2 cm mostly being the length of the single mode optical fiber that is part of the resonator. Required coupling of the VCSEL to the fiber optic and transmission along the intra-cavity fiber optic cable results in a loss of efficiency and problems with noise and resolution.

In view of the above, it is an object of the invention to provide an efficient multi-channel DWDM transmitter.

SUMMARY OF THE INVENTION

In accord with the above object, a multi-channel light source for use with a wavelength division multiplexed optical communication system includes a modified vertical cavity surface emitting laser (VCSEL) including a gain region and a resonator reflector layer at a first end for coupling with an optical fiber. A pumping source excites a gain region of the laser. An external cavity couples at a second end of the modified VCSEL and has a mirrored end for forming a resonant cavity with the resonator reflector layer permitting the light source to produce a multi-channel optical signal. The modified VCSEL has a cavity length that is substantially extended compared with a conventional VCSEL which has a resonant cavity formed within a layer structure of the conventional VCSEL.

In further accord with the above object, a multi-channel light source for use with a wavelength division multiplexed optical communication system is provided including, a modified vertical cavity surface emitting laser (VCSEL) including a gain region and a resonator reflector layer at a first end for coupling with an optical transmission medium, a pumping source for exciting a gain region of the laser, an oscillating signal generator for providing active mode-locking in the gain region of the laser, and an external cavity coupling at a second end of the modified VCSEL and having a mirrored end for forming a resonant cavity with the resonator reflector layer and permitting the light source to produce a multi-channel optical signal, wherein the modified VCSEL has a cavity length that is substantially extended compared with a conventional VCSEL which has a resonant cavity formed within a layer structure of the conventional VCSEL.

In further accord with the above object, a multi-channel light source for use with a wavelength division multiplexed optical communication system is provided including a modified vertical cavity surface emitting laser (VCSEL) including a gain region and a resonator reflector layer at a first end for coupling with an optical transmission medium, a pumping source for exciting a gain region of the laser, a saturable absorber for providing passive mode-locking in the gain region of the laser, and an external cavity coupling at a second end of the modified VCSEL and having a mirrored end for forming a resonant cavity with the resonator reflector layer and permitting the light source to produce a multi-channel optical signal, wherein the modified VCSEL has a cavity length that is substantially extended compared with a conventional VCSEL which has a resonant cavity formed within a layer structure of the conventional VCSEL.

In further accord with the above object, a multi-channel light source for use with a wavelength division multiplexed optical communication system is provided including a modified vertical cavity surface emitting laser (VCSEL) including a gain region and a resonator reflector layer at a first end for coupling with an optical transmission medium, a pumping source for exciting a gain region of the laser, a mode-locker for providing mode-locking in the gain region of the laser, and an external cavity coupling at a second end of the modified VCSEL and having a mirrored end for forming a resonant cavity with the resonator reflector layer and permitting the light source to produce a multi-channel optical signal, wherein the modified VCSEL has a cavity length that is substantially extended compared with a conventional VCSEL which has a resonant cavity formed within a layer structure of the conventional VCSEL.

In further accord with the above object, a multi-channel light source for use with a wavelength division multiplexed optical communication system is provided including a modified vertical cavity surface emitting laser (VCSEL) including a gain region and a resonator reflector layer at a first end for coupling with an optical transmission medium, a pumping source for exciting a gain region of the laser, a passive mode-locker means for providing passive mode-locking in the gain region of the laser, and an external cavity coupling at a second end of the modified VCSEL and having a mirrored end for forming a resonant cavity with the resonator reflector layer and permitting the light source to produce a multi-channel optical signal, wherein the modified VCSEL has a cavity length that is substantially extended compared with a conventional VCSEL which has a resonant cavity formed within a layer structure of the conventional VCSEL.

In further accord with the above object, a multi-channel light source for use with a wavelength division multiplexed optical communication system is provided including a modified vertical cavity surface emitting laser (VCSEL) including a gain region and a resonator reflector layer at a first end for coupling with an optical transmission medium, a pumping source for exciting a gain region of the laser, an active mode-locker for providing active mode-locking in the gain region of the laser, and an external cavity coupling at a second end of the modified VCSEL and having a mirrored end for forming a resonant cavity with the resonator reflector layer and permitting the light source to produce a multi-channel optical signal, wherein the modified VCSEL has a cavity length that is substantially extended compared with a conventional VCSEL which has a resonant cavity formed within a layer structure of the conventional VCSEL.

INCORPORATION BY REFERENCE

The following references are hereby incorporated by reference into the detailed description of the preferred embodiments, and also as disclosing alternative embodiments of elements or features of the preferred embodiment not otherwise set forth in detail above or below or in the drawings. A single one or a combination of two or more of these references may be consulted to obtain a variation of the preferred embodiment described above. In this regard, further patent, patent application and non-patent references, and discussion thereof, cited in the background and/or elsewhere herein are also incorporated by reference into the detailed description of the preferred embodiment with the same effect as just described with respect to the following references:

U.S. Pat. Nos. 5,347,525, 5,526,155, 6,141,127, and 5,631,758;

Wilmsen, Temkin and Coldren, et al., "Vertical Cell Surface Emitting Lasers, 2nd edition;

Ulrich Fiedler and Karl Ebeling, "Design of VCSEL's for Feedback Insensitive Data Transmission and External Cavity Active Mode-Locking", IEEE JSTQE, Vol 1, No. 2 (June 1995); and J. Boucart, et al., 1-mW CW-RT Monolithic VCSEL at 1.55 $\mu$m, IEEE Photonics Technology Letters, Vol. 11, No. 6 (June 1999).

DETAILED DESCRIPTION OF THE PREFERRED EMBODIMENTS

A multichannel light source to be used in wavelength division multiplexed optical communication systems is described below. The device uses a significantly reduced number of lasers than conventional systems, and preferably only a single laser source is used, for emitting at the multiple frequencies useful in WDM applications. The light source includes a laser cavity containing multiple longitudinal modes of emission, wherein the length of the cavity is preferably adjustable in order to provide a desired spacing between the longitudinal modes.

The system preferably includes an approximately 50 GHz mode-locker, an electrical or optical pump source, and a modified vertical cavity surface emitting laser (VCSEL) with an adjustable cavity provided preferably by removing a reflecting surface layer of the VCSEL and adding an external cavity reflector. The external cavity reflector preferably includes a concave reflecting surface spaced substantially further from the remaining reflecting surface of the layered structure than where the removed reflecting surface layer was located. The multiple frequency output of the cavity is then coupled with an erbium-doped fiber amplifier (EDFA) through a pulse spreading fiber for DWDM applications.

In addition, means are described for preferably fixing relative amplitudes of emission into a substantial fraction of the longitudinal modes, and means are additionally described to preferably maximize the spectral bandwidth over which the modes maintain a fixed relative amplitude by designing the laser cavity to have minimal variation of refractive index with frequency over the emission frequency range of interest.

Figure 1:
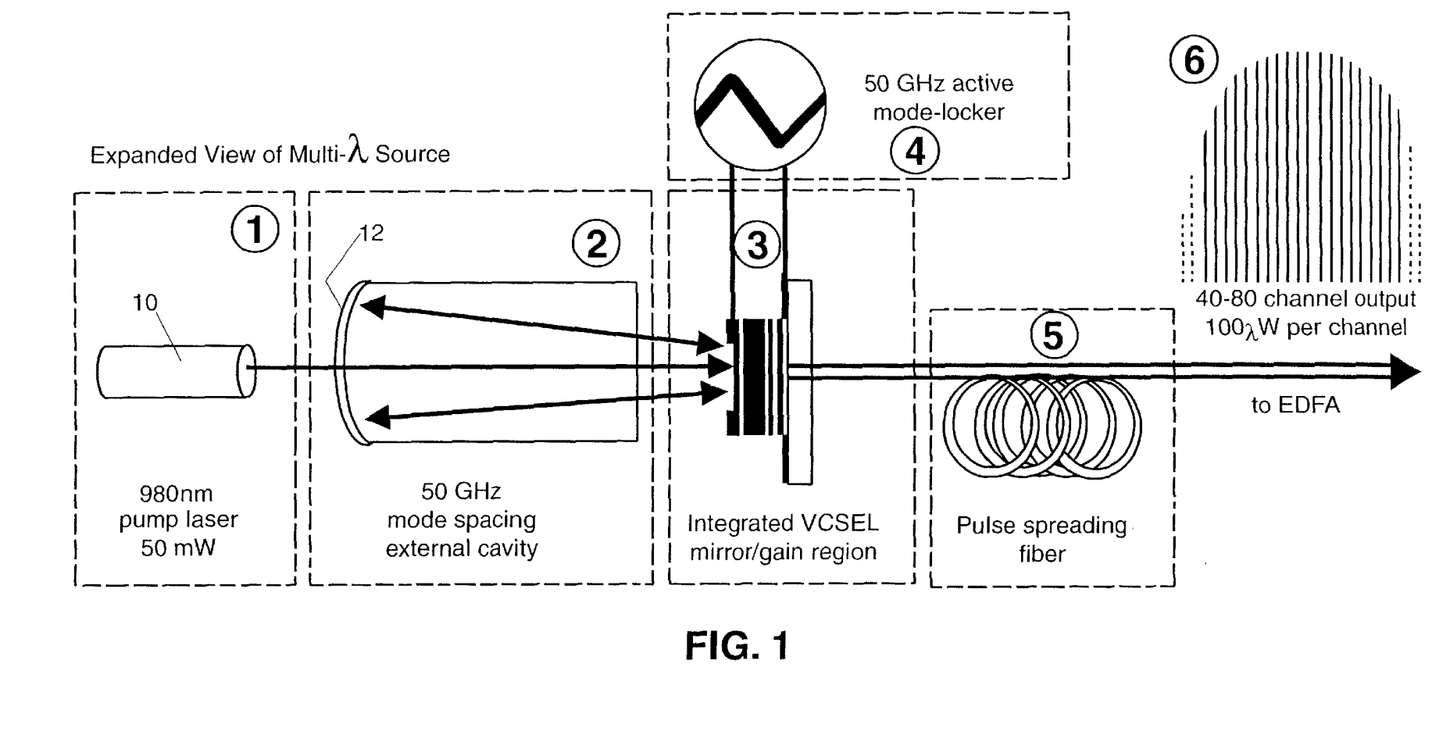
FIG. 1 schematically shows a multiple channel light source for a WDM optical communications system according to a preferred embodiment.

FIG. 1 schematically shows a multiple channel light source for a WDM optical communications system according to a preferred embodiment. The light source depicted schematically at FIG. 1 generally includes elements labeled 1–6 in FIG. 1.

Elements 2 and 3 are the laser cavity for the device, with element 3 being an electrically and/or optically driven vertical cavity laser amplifying structure, and element 2 being an external cavity formed, for example, with a gradient index lens with a mirrored surface at its outermost surface, or left-most surface in FIG. 1. Elements 2 and 3 will be described in more detail with respect to FIGS. 2a–5b.

Element 1 is an external pump laser 10 which may be used to energize the laser cavity. Alternatively, the laser cavity may be electrically pumped. Many alternative methods of photo-pumping and electrical pumping of VCSEL gain media are known in the art (see, e.g., Wilmsen, Temkin and Coldren, "Vertical Cavity Surface Emitting lasers", 2nd edition (Cambridge Press), which is hereby incorporated by reference in its entirety). Some embodiments wherein one of photopumping and electrical pumping is preferred are described below. For example, photo-pumping is preferred for use with the arrangement of FIG. 3a (see description, below), while electrical pumping is preferred for use with the arrangement of FIG. 3b (see description, below).

As shown in FIG. 1, when photo-pumping is selected the pump laser emits around a wavelength 980 nm and at 50 mW of optical power. The pump laser is preferably a diode laser operated in cw mode. The pump laser. may be modulated for mode-locking, although mode-locking in a preferred embodiment is described below. The pump laser of element 1 is disposed with respect to the cavity 2 such that the curved surface, or left most surface as shown in FIG. 1, images the emitted beam from the pump laser 10 at the gain medium of the VCSEL of element 3.

Figure 4:
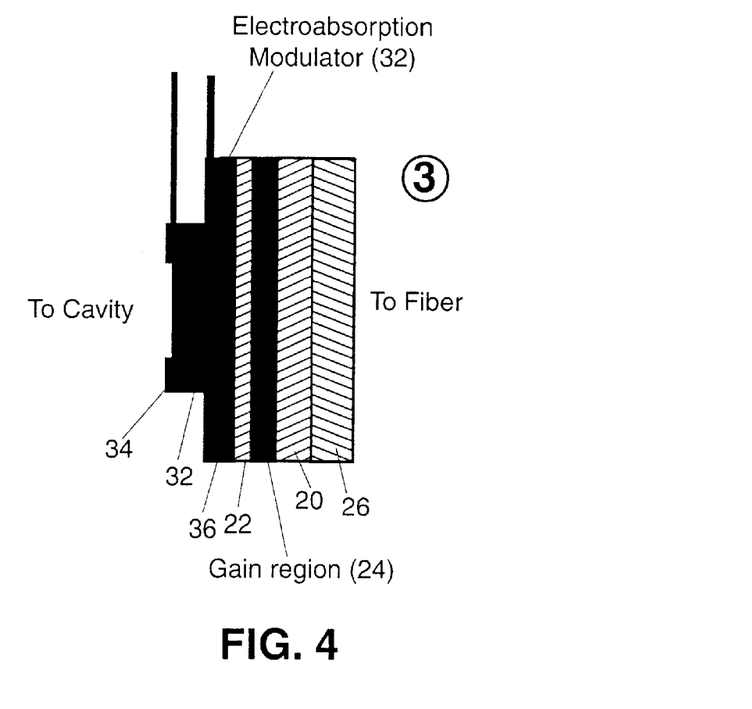
FIG. 4 schematically shows a third modified VCSEL for use with a multiple channel light source according to a preferred embodiment.

Element 4 is an electrically oscillating signal applied to the gain element or to an additionally inserted loss element in order to provide for active mode locking. The additional loss element may be an additional electroabsorption modulator layer of the VCSEL device as shown in FIG. 4 and described below. As mentioned above, electrical energization of the VCSEL may be used, and when used, it is preferably supplied at the same port as the mode-locking input, as an alternative to using the pump laser 10 of element 1. That is, the input electrical pumping itself is preferably modulated and serves as the mode-locker. The mode-locking provides a fixed amplitude relationship of the modes with temporal stability and increases the number of modes. Further discussion of modulation is set forth below with respect to FIGS. 2b and 4. The signal generator of element 4 is preferably 50 mW and may be obtained from the Microwave Development Company as a 50 GHz Gunn oscillator.

Alternatively, an apparatus including passive mode-locking, rather than active-mode-locking may be used. For passive mode-locking, a saturable absorber may be used that may be similar to the electro-absorption modulator described herein, except that highfrequency modulation is not applied to the saturable absorber when the device is operating in a passive mode-locking manner. However, a D.C. bias may be applied to the saturable absorber to modify the strength of its absorption.

Also alternatively, an apparatus not including mode-locking may be used, although use of mode-locking is preferred. With no mode-locking, the longitudinal modes with still be present in the cavity. However, the amplitudes of the modes will be under reduced control, resulting in greater noise between the modes as energies "slosh" back and forth between the modes. Thus, without mode-locking, the amplitudes of the modes will have less relative stabilization than if mode-locking is used. A low frequency modulation may be used to homogenize the modes to stabilize their relative amplitudes when no mode-locking is used. With or without such low frequency modulation for stabilizing the relative amplitudes of the modes, an embodiment may be realized without mode-locking according to an alternative embodiment.

Element 5 is a pulse spreading fiber which may be used to decrease the peak amplitude of the pulses that are emitted from the device under mode-locked operation. The pulse spreading fiber of element 5 transmits the multiple channel signal from the cavity of the transmitter (elements 2 and 3) to an EDFA. Due to the dispersion properties that are associated with most types of optical fiber, the pulse spreading fiber can include an appropriate length of virtually any optical fiber. The higher the dispersion in the fiber, the shorter the length that will be preferably used.

Element 6 is not really a physical element of the arrangement of FIG. 1, and is rather a plot depicting an amplitude versus frequency spectral distribution of the light emission from the device of FIG. 1. As shown, the output is preferably between 4 and 128 channels (and could be more), at about 100 $\mu$W per channel. As discussed below with reference to FIG. 2b, the envelope of the amplitude versus frequency plot of element 6 will be more Gaussian when AM mode-locking is used and have a flatter shape when FM mode-locking is used, rendering the FM mode-locking preferred provided frequency chirp is acceptable, although either may be used advantageously depending on particular setup and application specifications.

Elements 1, 4, and 5 are a photo-pumping source such as a pump laser 10, electrical oscillating signal generator and pulse spreading fiber, respectively, that may be conventional items such as are readily known and understood by those skilled in the art. Elements 2 and 3 of FIG. 1 will now be set forth in detail below.

Elements 2 and 3 of FIG. 1 are an external cavity and integrated VCSEL, respectively, according to a preferred embodiment, wherein several alternative designs and variations will be discussed below with reference to FIGS. 2a–5b. In general, the cavity length of the system including elements 2 and 3 is greatly extended compared with a conventional VCSEL device. The cavity may be, e.g., between a few hundred microns and several millimeters, and is particularly preferably around 2–3 mm in physical length for a mode-spacing of 50 GHz. For example, at 50 GHz and for a refractive index n≈1 (such as for an air or inert gas filled cavity), then the cavity will have a physical length of about 3 mm, which provides a 3 mm optical path length corresponding to 50 GHz. For a cavity material such as glass, e.g., n=1.5, then the physical length will be around 2 mm to provide the optical path length of 2 mm×1.5=3 mm, again corresponding to a 50 GHz mode spacing.

The cavity length may be increased to reduce the mode-spacing. For example, by doubling the cavity length, e.g., to 4–6 mm, the mode-spacing may be reduced to 25 GHz, or by again doubling the cavity length, e.g., to 8–12 mm, the mode-spacing may be reduced to 12.5 GHz. The mode-spacing may be increased, if desired, by alternatively reducing the cavity length, e.g., by reducing the cavity length to half, e.g., 1–1.5 mm to increase the mode-spacing to 100 GHz. Generally, the mode-spacing may be advantageously selected by adjusting the cavity to a corresponding cavity length. The device of the preferred embodiment may utilize other means for reducing the mode-spacing as understood by those skilled in the art.

This extension of cavity length from that of a conventional VCSEL is permitted by the removal or partial removal of a mirrored reflector surface of the VCSEL and substitution of a mirrored surface of an external cavity of element 2 having a mirrored outer surface 12. In a preferred embodiment, the second mirrored reflector surface of the VCSEL is simply not formed on the device during manufacture, with the specific intention that the manufactured device be used with the external cavity apparatus of the preferred embodiment herein. The second mirrored surface may instead be formed such that it has a sufficiently low reflectivity that the external cavity of element 2 of FIG. 1 is included in the resonance cavity of the device.

The extension of the VCSEL optical cavity out to 1.5–15 mm permits a 10–100 GHz mode spacing, since the cavity will support a number of modes having a spacing that depends on the inverse of the cavity length (i.e., c/2nL, where n is the refractive index of the cavity material and L is the cavity length). The VCSEL with external cavity device for providing multiple channel signal output according to the preferred embodiment herein is preferably configured for use in the telecom band around 1550 nm, and alternatively with the telecom short distance band around 1300 nm or the very short range 850 nm band. In the 1550 nm band, 100, 50 and 12.5 GHz cavities are of particular interest as they correspond to standard DWDM channel spacings.

The VCSEL itself is around 15 microns tall, or in a direction transverse to the length of the cavity 2 in FIG. 1. The VCSEL preferably comprises a gain medium of InGaAsP or InGaAs and In GaAlAs or InGaAsP or AlGaAs mirrors (or mirrors formed of other materials according to desired wavelengths as taught, e.g., in Wilmsen, Temkin and Coldren, et al., "Vertical Cavity Surface Emitting Lasers, 2nd edition, Chapter 8), or according to the preferred embodiment, a single InGaAlAs partially reflecting outcoupler mirror which couples with the pulse spreading fiber of element 5 to output the signal to the EDFA. The VCSEL size can be advantageously varied to meet specifications. The external cavity may also be advantageously varied, e.g., to vary its length for adjusting the mode spacing of the device. In addition the power of the device may be advantageously varied providing a highly versatile DWDM transmitter.

Figure 2A:
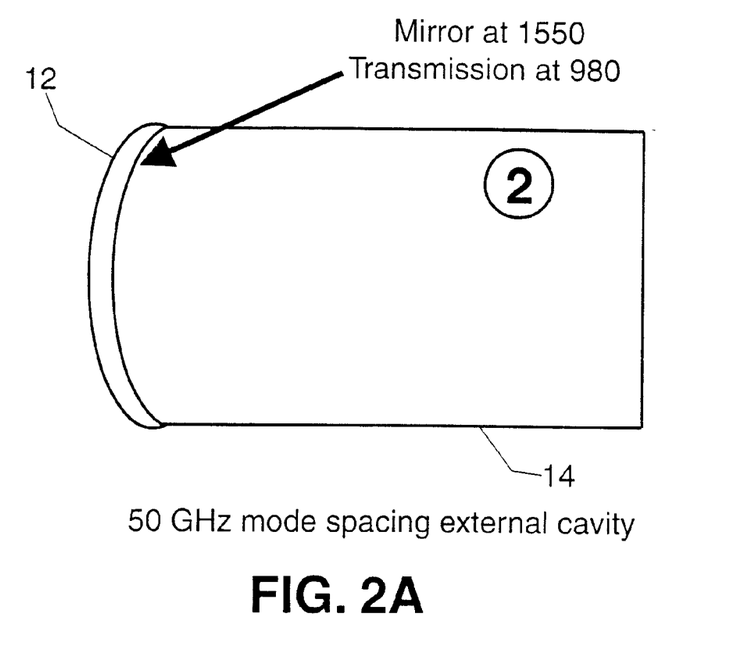
FIG. 2a schematically shows a first mode spacing cavity according to a preferred embodiment.
Figure 2B:
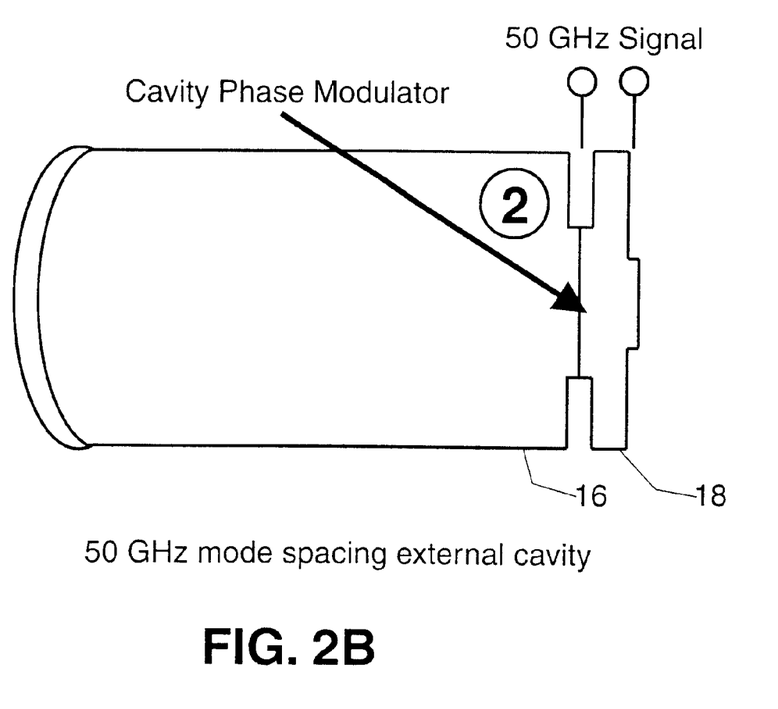
FIG. 2b schematically shows a second mode spacing cavity according to a preferred embodiment.

FIGS. 2a and 2b schematically show first and second mode spacing cavities according to preferred embodiments. Referring to FIGS. 2a–2b, detailed views of alternative external cavities corresponding to element 2 of FIG. 1 are shown. In the first variant shown at FIG. 2a, the cavity is formed by a solid lens 14 of either conventional or gradient index design, and may be formed of glass. When a gradient index lens is used, the index of refraction of the material of the lens 14 varies (e.g., decreases) with distance from the center optical axis of the resonant cavity. Such GRIN lens provides efficient collection of the strongly divergent light emitted from the laser cavity. In an embodiment using a GRIN lens, the mirrored surface 12 could be curved or flat, depending on design considerations.

The lens 14 has one or more coatings 12 on its remote surface such that it efficiently reflects incident light emitted from the VCSEL as a resonator reflector, preferably around 1550 nm for the telecom band as mentioned above. In the case of optical pumping, the coated surface 12 also preferably transmits and images the input radiation from the pump light source 10 of element 1 onto gain medium of the VCSEL of element 3 of FIG. 1. The mirror 12 is preferably formed of alternating high and low refractive index materials to build up a high reflectivity, such as alternating quarter-wavelength layers of $TiO_2/SiO_2$ or other such materials known to those skilled in the art.

For each of the just mentioned reasons or functions of the coated and curved surface 12 on the lens 14, the radius of curvature of the lens 14 having the coating 12 is around the length the external cavity. Emitted radiation from the VCSEL will diverge outward from the gain region of the VCSEL and substantially be reflected directly back to the gain region when the radius of curvature is approximately the cavity length, or around 2–3 mm for a 50 GHz mode-spacing device. In addition, the pump laser radiation will preferably be collimated, and so the lens 14 having the radius of curvature of the length of the cavity will image the input pump radiation.

In the second variant shown at FIG. 2b, the lens 14 forming the cavity is segmented into a lens component 16 plus an intracavity modulation element or cavity phase modulator 18 which is used to modulate the length of the cavity or the loss in the cavity. For modulating the length of the cavity, the preferably 50 GHz signal is applied to the region 18, and region 18 preferably includes a strongly electro-optic material, and the optical path length varies as the refractive index of the modulator section 18 varies with the oscillating electrical field. Modulation of the length of the cavity results in FM mode-locking, whereas modulation of the loss in the cavity results in AM mode-locking, each with its own distinct and potentially useful set of mode locking properties. Either may be used with the preferred embodiments herein. The modulator of FIG. 2b serves the function of mode-locking by changing cavity length. In comparision, the modulator of FIG. 4 (see below) generates mode-locking by changing cavity losses as a set of layers grown on the cavity. Element 4 is serves to apply the signal for mode-locking to element 18 of FIG. 2b.

The lens 14 and lens section 16 or the embodiments of FIGS. 2a and 2b, respectively, is formed of a material with either no dispersion or very little dispersion. This is so that the mode spacing does not change substantially with frequency. Therefore, the material of the lens 14 or 16 may be vacuum, air or an inert gas such as nitrogen or argon. A transparent solid or liquid may also be used as the material of the lens 14 or 16, wherein dispersion can be designed to be below acceptable levels by careful attention to the dispersion characteristics of the materials used.

Specifically, AM mode-locking typically results in a gaussian spectral envelope (see element 6 of FIG. 1), whereas FM mode-locking results in a substantially flat spectral envelope with a more rapid rolloff at its extremes. This substantially flat profile achieved with FM mode-locking is in many cases desired. Generally, there is potential utility to providing for both, and perhaps simultaneous, AM and FM mode-locking.

Figure 3A:
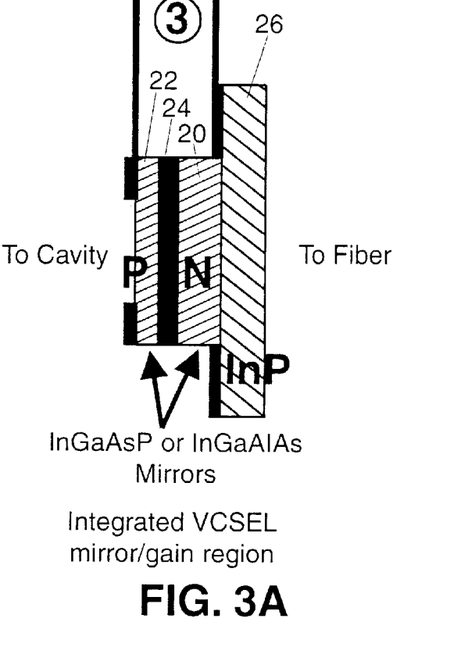
FIG. 3a schematically shows a first modified VCSEL for use with a multiple channel light source according to a preferred embodiment.
Figure 3B:
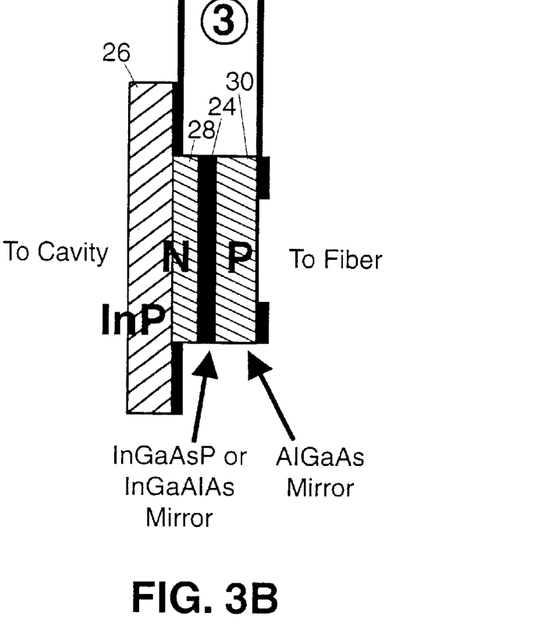
FIG. 3b schematically shows a second modified VCSEL for use with a multiple channel light source according to a preferred embodiment.

FIGS. 3a and 3b schematically show first and second modified VCSELs for use with multiple channel light sources according to preferred embodiments. The structures shown in FIGS. 3a–3b correspond to variations of element 3 of FIG. 1.

FIG. 3a shows a structure in which the mirrors are preferably all lattice matched materials. This structure relies on effective fabrication of a high reflectivity n-type mirror 20 within epitaxial InP based materials. The p-type mirror 22 is lower in reflectivity, but its reflectivity is supplemented by the reflectivity of the external cavity mirror 12 of element 2 of FIG. 1. In this sense, there may be no mirror 22 or a layer having little or no reflectivity over the gain layer 24. The mirrors 20 and 22 are preferably made of InGaAsP or InGaAlAs. The gain region 24 is shown between the mirrors 20 and 22 of FIG. 3a and is preferably formed of a III-V or II-VI light emitting material which efficiently emits and amplifies light at the wavelength of interest.

As shown in the embodiment of FIG. 3a, the n-type mirror 20 is formed on an InP substrate 26 on the cavity side of the substrate 26. The gain region 24 on the mirror 20 and the mirror 22 on the gain region. The mode locker (element 3 of FIG. 1) is contacted across the structure including the mirrors 20, 22 and the gain region 24.

In the embodiment of FIG. 3a, photopumping (element 1 of FIG. 1) may be used. Inefficiencies associated with the mirrors in the n-type-gain region-p-type layer structure over the InP substrate of the VCSEL of FIG. 3a may lead to inefficient electrical injection which could result in inefficient lasing and reduced output power capability.

FIG. 3b shows a structure with a substrate-side n-type mirror 28 preferably formed of InGaAsP or InGaAlAs materials facing the external cavity (element 3 of FIG. 1), and an exterior p-type mirror 30 comprising materials in the AlGaAs family. These AlGaAs materials are not lattice matched as in the embodiment of FIG. 3a. However, they form the upper mirror surface away from the active layer. As a result, the active layer is insensitive to defect formation caused by the lattice mismatch in the growth of the upper mirror 30. Advantageously efficient mirrors can be formed using AlGaAs structures in this embodiment, as detailed in J. Boucart, et al., 1-mW CW-RT Monolithic VCSEL at 1.55 μm, IEEE Photonics Technology Letters, Vol. 11, No. 6 (June 1999), which is hereby incorporated by reference.

FIG. 4 schematically shows a third modified VCSEL for use with a multiple channel light source according to a preferred embodiment. FIG. 4 shows a structure in which an additional electro-absorption modulator 32 is preferably included in the epitaxial structure. The structure begins as the structure shown in FIG. 3a. The structure of FIG. 3b may be used with the loss modulator of FIG. 4. A p-type layer is formed over the mirror 22. The electroabsorption modulator 32 is formed on the p-type layer 36 and a n-type layer 34 is formed over the modulator layer 32. The modulator 32 can be used to introduce loss modulation independently of the gain provided for in the gain region. The modulator 32 is preferably designed to have low capacitance and good high frequency response. In the case where no high frequency source is applied to an absorber as in FIG. 4, mode-locking can still occur as a result of passive mode-locking, in which the absorber saturates at high optical field strengths and the laser naturally oscillates in a pulsed mode or a mode-locked manner.

Figure 5A:
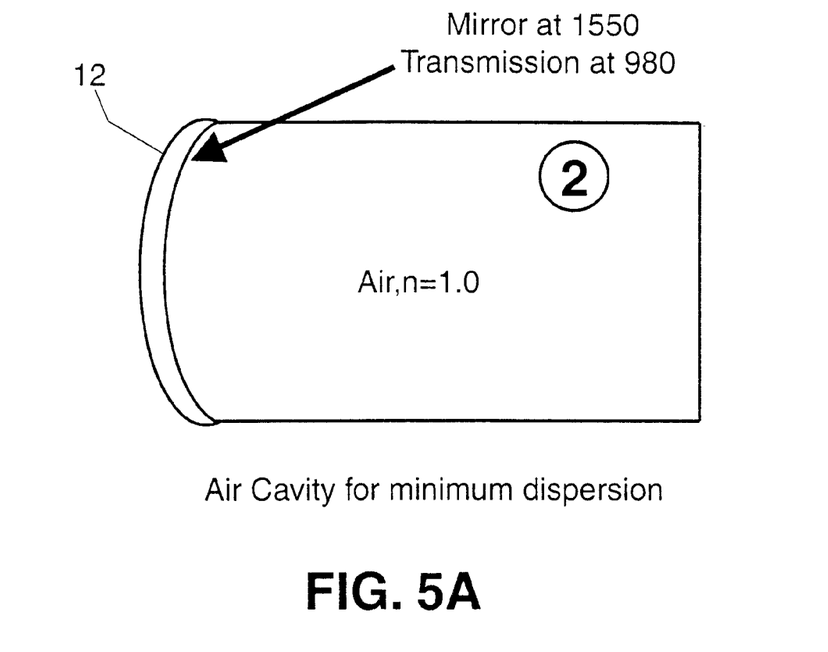
FIG. 5a schematically shows a third mode spacing cavity according to a preferred embodiment.
Figure 5B:
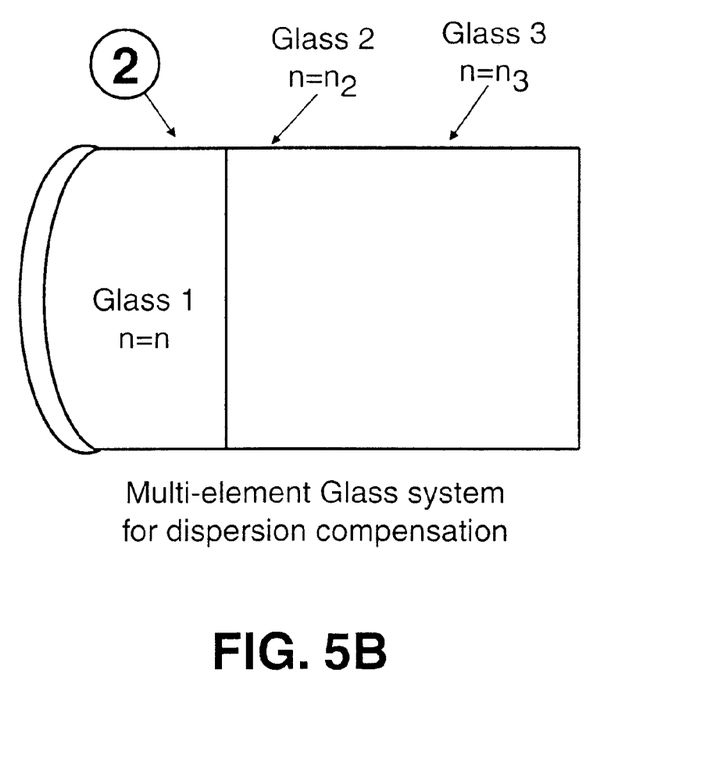
FIG. 5b schematically shows a fourth mode spacing cavity according to a preferred embodiment.

FIGS. 5a and 5b schematically show third and fourth mode spacing cavities according to preferred embodiments. FIGS. 5a and 5b show alternative designs of element 2 of FIG. 1 that may be used for reducing effects of dispersion of the light source according to preferred embodiments. In very broadband systems, variations of refractive index with frequency may result in variations of mode spacing frequency. This effect can serve to limit a range over which mode-locking can be achieved, and this is why the embodiments of FIGS. 5a and 5b are used in preferred embodiments. An external cavity that is filled with a semiconductor material, e.g., such as in an edge emitting laser cavity, will have very high dispersion, and the extent of mode-locking in such case is greatly limited.

FIG. 5a illustrates use of a gas such as air, or a substantial equivalent such as nitrogen gas or another inert gas or a gas that does not significantly photoabsorb at pump laser and VCSEL emission wavelengths of interest (e.g., around 1550 nm and 980 nm), as a material for filling the external cavity. Advantageously, the preferred gas such as air exhibits substantially no dispersion. In the case of FIG. 5a, the mirror may be part of a housing that is filled with the gas such as air or nitrogen.

FIG. 5b shows an alternative embodiment which is a multi-element system of optical materials such as glasses of different refractive indices. The different materials have compensating dispersions such that an overall dispersion may be reduced to a very low level over a frequency range of interest. FIG. 5b shows three regions of glass 1, glass 2 and glass 3 having refractive indices $n_1$, $n_2$ and $n_3$, respectively. More regions may be included.

A multi-channel light source for wavelength division multiplexed systems is thus realized according to the preferred embodiments set forth above and the object of the invention is met. The multi-channel transmitter provides the substantial advantage of providing many discrete and precisely controlled wavelengths and makes these wavelengths available for independent modulation and transmission. The light source for providing these multiple frequencies preferably comprises a single vertical cavity surface emitting laser having an external cavity of adjustable length and low dispersion. This greatly reduces the parts count, volume, weight and cost of a DWDM system, and reduces the dependence of production of these systems on the production of very complicated DFB lasers with low yield.

A composite cavity semiconductor laser device comprising a VCSEL or VCSEL-like cavity as one of the mirrors of the laser cavity has been described above. This VCSEL mirror will also provide the light amplification required for laser emission. Further elements of the cavity are elements of dispersion compensation and modulation.

Those skilled in the art will appreciate that the just-disclosed preferred embodiments are subject to numerous adaptations and modifications without departing from the scope and spirit of the invention. Therefore, it is to be understood that, within the scope and spirit of the invention, the invention may be practiced other than as specifically described above. In particular, the invention is to be interpreted in accordance with the appended claims, and equivalents thereof, without limitations being read from the specification above.

I claim:

1. A multi-channel light source for use with a wavelength division multiplexed optical communication system, comprising:

a modified vertical cavity surface emitting laser (VCSEL) including a gain region and a resonator reflector layer at a first end for coupling with an optical transmission medium, a pumping source for exciting a gain region of the laser; and an external cavity coupling at a second end of the modified VCSEL and having a mirrored end for forming a resonant cavity with the resonator reflector layer and permitting the light source to produce a multi-channel optical signal, wherein the modified VCSEL has a cavity length that is substantially extended compared with a conventional VCSEL, which conventional VCSEL has a resonant cavity formed within a layer structure of the conventional VCSEL.

2. The system of claim 1, wherein the modified VCSEL is formed without a mirror layer at the second end.

3. The system of claim 1, wherein the modified VCSEL is formed with a mirror layer at the second end at least substantially removed.

4. The system of claim 1, wherein the pumping source includes a pump laser.

5. The system of claim 4, wherein the pump laser is imaged through the external cavity at the gain region of the modified VCSEL.

6. The system of claim 1, wherein the pumping source is an electrical injection source coupled with the modified VCSEL.

7. The system of claim 6, wherein the electrical injection source is oscillated to also form an oscillating signal generator for active mode-locking.

8. The system of claim 1, wherein the external cavity includes a cavity phase modulator.

9. The system of claim 1, wherein the modified VCSEL includes from furthest to closest to the external cavity, a substrate, the resonator reflector layer at the first end, and the gain region.

10. The system of claim 9, wherein the pumping source is a pumping laser.

11. The system of claim 9, further including a low reflectivity layer on the gain region and plurality of layers over the low reflectivity layer including an electroabsorption modulator.

12. The system of claim 1, wherein the external cavity is filled with a gas.

13. The system of claim 12, wherein the gas is selected from the group of gases consisting of air, nitrogen and a noble gas.

14. The system of claim 1, wherein the external cavity includes a plurality of materials having different refractive indices for compensating a dispersion of each material.

15. The system of claim 1, wherein the optical signal includes between 4 and 128 channels.

16. The system of claim 1, wherein said multi-channel optical signal has a mode-spacing in a range between 1 GHz and 100 GHz.

17. The system of claim 1, wherein the optical signal has a mode spacing of substantially 12.5 GHz.

18. The system of claim 1, wherein the optical signal has a mode spacing of substantially 25 GHz.

19. The system of claim 1, wherein the optical signal has a mode spacing of substantially 50 GHz.

20. A multi-channel light source for use with a wavelength division multiplexed optical communication system, comprising:
    a modified vertical cavity surface emitting laser (VCSEL) including a gain region and a resonator reflector layer at a first end for coupling with an optical transmission medium,
    a pumping source for exciting a gain region of the laser;
    an oscillating signal generator for providing active mode-locking in the gain region of the laser; and
    an external cavity coupling at a second end of the modified VCSEL and having a mirrored end for forming a resonant cavity with the resonator reflector layer and permitting the light source to produce a multi-channel optical signal,
    wherein the modified VCSEL has a cavity length that is substantially extended compared with a conventional VCSEL, which conventional VCSEL has a resonant cavity formed within a layer structure of the conventional VCSEL.

21. The system of claim 20, wherein the modified VCSEL is formed without a mirror layer at the second end.

22. The system of claim 20, wherein the modified VCSEL is formed with a mirror layer at the second end at least substantially removed.

23. The system of claim 20, wherein the pumping source includes a pump laser.

24. The system of claim 23, wherein the pump laser is imaged through the external cavity at the gain region of the modified VCSEL.

25. The system of claim 20, wherein the pumping source is an electrical injection source coupled with the modified VCSEL.

26. The system of claim 25, wherein the electrical injection source is oscillated to also form the oscillating signal generator.

27. The system of claim 20, wherein the external cavity includes a cavity phase modulator.

28. The system of claim 20, wherein the modified VCSEL includes from furthest to closest to the external cavity, a substrate, the resonator reflector layer at the first end, and the gain region.

29. The system of claim 28, wherein the pumping source is a pumping laser.

30. The system of claim 28, further including a low reflectivity layer on the gain region and plurality of layers over the low reflectivity layer including an electroabsorption modulator.

31. The system of claim 20, wherein the modified VCSEL includes from furthest to closest to the external cavity, the resonator reflector layer at the first end, the gain region, a low reflectivity layer, and a substrate.

32. The system of claim 20, wherein the external cavity is filled with a gas.

33. The system of claim 32, wherein the gas is selected from the group of gases consisting of air, nitrogen and a noble gas.

34. The system of claim 20, wherein the external cavity includes a plurality of materials having different refractive indices for compensating a dispersion of each material.

35. The system of claim 20, wherein the optical signal includes between 4 and 128 channels.

36. The system of claim 20, wherein said multi-channel optical signal has a mode-spacing in a range between 1 GHz and 100 GHz.

37. The system of claim 20, wherein the optical signal has a mode spacing of substantially 12.5 GHz.

38. The system of claim 20, wherein the optical signal has a mode spacing of substantially 25 GHz.

39. The system of claim 20, wherein the optical signal has a mode spacing of substantially 50 GHz.

40. A multi-channel light source for use with a wavelength division multiplexed optical communication system, comprising:
    a modified vertical cavity surface emitting laser (VCSEL) including a gain region and a resonator reflector layer at a first end for coupling with an optical transmission medium,
    a pumping source for exciting a gain region of the laser; and
    a saturable absorber for providing passive mode-locking in the gain region of the laser; and
    an external cavity coupling at a second end of the modified VCSEL and having a mirrored end for forming a resonant cavity with the resonator reflector layer and permitting the light source to produce a multi-channel optical signal,
    wherein the modified VCSEL has a cavity length that is substantially extended compared with a conventional VCSEL, which conventional VCSEL has a resonant cavity formed within a layer structure of the conventional VCSEL.

41. The system of claim 40, wherein the modified VCSEL is formed without a mirror layer at the second end.

42. The system of claim 40, wherein the modified VCSEL is formed with a mirror layer at the second end at least substantially removed.

43. The system of claim 40, wherein the pumping source includes a pump laser.

44. The system of claim 43, wherein the pump laser is imaged through the external cavity at the gain region of the modified VCSEL.

45. The system of claim 40, wherein the pumping source is an electrical injection source coupled with the modified VCSEL.

46. The system of claim 40, wherein the external cavity includes a cavity phase modulator.

47. The system of claim 40, wherein the modified VCSEL includes from furthest to closest to the external cavity, a substrate, the resonator reflector layer at the first end, and the gain region.

48. The system of claim 47, wherein the pumping source is a pumping laser.

49. The system of claim 47, further including a low reflectivity layer on the gain region and plurality of layers over the low reflectivity layer including an electroabsorption modulator.

50. The system of claim 40, wherein the modified VCSEL includes from furthest to closest to the external cavity, the resonator reflector layer at the first end, the gain region, a low reflectivity layer, and a substrate.

51. The system of claim 40, wherein the external cavity is filled with a gas.

52. The system of claim 51, wherein the gas is selected from the group of gases consisting of air, nitrogen and a noble gas.

53. The system of claim 40, wherein the external cavity includes a plurality of materials having different refractive indices for compensating a dispersion of each material.

54. The system of claim 40, wherein the optical signal includes between 4 and 128 channels.

55. The system of claim 40, wherein said multi-channel optical signal has a mode-spacing in a range between 1 GHz and 100 GHz.

56. The system of claim 40, wherein the optical signal has a mode spacing of substantially 12.5 GHz.

57. The system of claim 40, wherein the optical signal has a mode spacing of substantially 25 GHz.

58. The system of claim 40, wherein the optical signal has a mode spacing of substantially 50 GHz.

59. A multi-channel light source for use with a wavelength division multiplexed optical communication system, comprising:

a modified vertical cavity surface emitting laser (VCSEL) including a gain region and a resonator reflector layer at a first end for coupling with an optical transmission medium, a pumping source for exciting a gain region of the laser; and a mode-locker for providing mode-locking in the gain region of the laser; and an external cavity coupling at a second end of the modified VCSEL and having a mirrored end for forming a resonant cavity with the resonator reflector layer and permitting the light source to produce a multi-channel optical signal, wherein the modified VCSEL has a cavity length that is substantially extended compared with a conventional VCSEL, which conventional VCSEL has a resonant cavity formed within a layer structure of the conventional VCSEL.

60. The system of claim 59, wherein said multi-channel optical signal has a mode-spacing in a range between substantially 12.5 GHz and 100 GHz.

61. The system of claim 59, wherein the modified VCSEL is formed without a mirror layer at the second end.

62. The system of claim 59, wherein the modified VCSEL is formed with a mirror layer at the second end at least substantially removed.

63. The system of claim 59, wherein the modified VCSEL includes from furthest to closest to the external cavity, the resonator reflector layer at the first end, the gain region, a low reflectivity layer, and a substrate.

64. The system of claim 59, wherein the external cavity is filled with a gas.

65. The system of claim 64, wherein the gas is selected from the group of gases consisting of air, nitrogen and a noble gas.

66. The system of claim 59, wherein the external cavity includes a plurality of materials having different refractive indices for compensating a dispersion of each material.

67. A multi-channel light source for use with a wavelength division multiplexed optical communication system, comprising:

a modified vertical cavity surface emitting laser (VCSEL) including a gain region and a resonator reflector layer at a first end for coupling with an optical transmission medium, a pumping source for exciting a gain region of the laser; and a passive mode-locker means for providing passive mode-locking in the gain region of the laser; and an external cavity coupling at a second end of the modified VCSEL and having a mirrored end for forming a resonant cavity with the resonator reflector layer and permitting the light source to produce a multi-channel optical signal, wherein the modified VCSEL has a cavity length that is substantially extended compared with a conventional VCSEL, which conventional VCSEL has a resonant cavity formed within a layer structure of the conventional VCSEL.

68. The system of claim 67, wherein said multi-channel optical signal has a mode-spacing in a range between 12.5 GHz and 100 GHz.

69. The system of claim 67, wherein the modified VCSEL is formed without a mirror layer at the second end.

70. The system of claim 67, wherein the modified VCSEL is formed with a mirror layer at the second end at least substantially removed.

71. The system of claim 67, wherein the modified VCSEL includes from furthest to closest to the external cavity, the resonator reflector layer at the first end, the gain region, a low reflectivity layer, and a substrate.

72. The system of claim 67, wherein the external cavity is filled with a gas.

73. The system of claim 72, wherein the gas is selected from the group of gases consisting of air, nitrogen and a noble gas.

74. The system of claim 67, wherein the external cavity includes a plurality of materials having different refractive indices for compensating a dispersion of each material.

75. A multi-channel light source for use with a wavelength division multiplexed optical communication system, comprising:

a modified vertical cavity surface emitting laser (VCSEL) including a gain region and a resonator reflector layer at a first end for coupling with an optical transmission medium, a pumping source for exciting a gain region of the laser; and an active mode-locker for providing active mode-locking in the gain region of the laser; and an external cavity coupling at a second end of the modified VCSEL and having a mirrored end for forming a resonant cavity with the resonator reflector layer and permitting the light source to produce a multi-channel optical signal, wherein the modified VCSEL has a cavity length that is substantially extended compared with a conventional VCSEL, which conventional VCSEL has a resonant cavity formed within a layer structure of the conventional VCSEL.

76. The system of claim 75, wherein said multi-channel optical signal has a mode-spacing in a range between 12.5 GHz and 100 GHz.

77. The system of claim 75, wherein the modified VCSEL is formed without a mirror layer at the second end.

78. The system of claim 75, wherein the modified VCSEL is formed with a mirror layer at the second end at least substantially removed.

79. The system of claim 75, wherein the modified VCSEL includes from furthest to closest to the external cavity, the resonator reflector layer at the first end, the gain region, a low reflectivity layer, and a substrate.

80. The system of claim 75, wherein the external cavity is filled with a gas.

81. The system of claim 80, wherein the gas is selected from the group of gases consisting of air, nitrogen and a noble gas.

82. The system of claim 75, wherein the external cavity includes a plurality of materials having different refractive indices for compensating a dispersion of each material.

* * * * *